(12) United States Patent
Mak et al.

(10) Patent No.: US 10,014,450 B1
(45) Date of Patent: Jul. 3, 2018

(54) METHOD FOR MANUFACTURING A LIGHT EMITTING DIODE DEVICE AND THE LIGHT EMITTING DIODE DEVICE SO MANUFACTURED

(71) Applicant: ASM Technology Singapore Pte Ltd, Singapore (SG)

(72) Inventors: Ka Yee Mak, Hong Kong (HK); Ho Yin Wong, Hong Kong (HK); Ho Yin Lou, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/428,302

(22) Filed: Feb. 9, 2017

(51) Int. Cl.
*H01L 33/00* (2010.01)
*H01L 33/50* (2010.01)
*H01L 33/60* (2010.01)
*H01L 21/683* (2006.01)

(52) U.S. Cl.
CPC ........ *H01L 33/505* (2013.01); *H01L 21/6835* (2013.01); *H01L 33/0095* (2013.01); *H01L 33/60* (2013.01); *H01L 2221/68327* (2013.01); *H01L 2933/0041* (2013.01); *H01L 2933/0058* (2013.01)

(58) Field of Classification Search
CPC ......... H01L 2924/0002; H01L 2924/00; H01L 2933/0041; H01L 33/005; H01L 33/502; H01L 33/505; E04B 1/86; E04B 2001/8461; E04B 9/0428; E04B 9/045; E04B 9/0464; E04B 9/32; E04B 9/34; F21S 8/00; F21Y 2103/33; F21Y 2107/90; F21Y 2113/13; F21Y 2115/10; Y10T 428/1476; Y10T 428/1495; Y10T 428/163; Y10T 83/04
USPC ...................................................... 257/98, 1
See application file for complete search history.

(56) References Cited

U.S. PATENT DOCUMENTS

| | | | |
|---|---|---|---|
| 6,650,044 B1 | 11/2003 | Lowery | 313/502 |
| 7,049,159 B2 | 5/2006 | Lowery | 438/22 |
| 8,921,131 B2 | 12/2014 | Chen et al. | 438/27 |
| 9,773,956 B2* | 9/2017 | Richter | H01L 33/505 |
| 2014/0339582 A1* | 11/2014 | Matsumura | H01L 33/505 257/98 |

* cited by examiner

*Primary Examiner* — Mohammed Shamsuzzaman
(74) *Attorney, Agent, or Firm* — Ostrolenk Faber LLP

(57) ABSTRACT

The invention provides a light emitting diode device that comprises a light emitting diode die. The method for manufacturing the light emitting diode device comprises positioning a first stencil over a carrier, printing a phosphor material onto the carrier through at least one aperture of the first stencil to form a phosphor material piece on the carrier, and attaching the light emitting diode die onto the printed phosphor material piece.

7 Claims, 13 Drawing Sheets

US 10,014,450 B1

METHOD FOR MANUFACTURING A LIGHT EMITTING DIODE DEVICE AND THE LIGHT EMITTING DIODE DEVICE SO MANUFACTURED

TECHNICAL FIELD

Various aspects of this disclosure relate to a light emitting diode device and to a method for manufacturing a light emitting diode device, e.g. to a light emitting diode device which includes a reflector material layer and a method for manufacturing such a light emitting diode device.

BACKGROUND

Light emitting diode ("LED") devices usually show low consumption of electrical power, low heat generation as well as a long lifetime and small volume. Due to these characteristics, LED devices are recently used as a light source in various lighting applications.

LED devices usually include LED dice mounted on a substrate. Such LED dice generally include a structure of stacked layers including various semiconductor layers enabling the LED die to emit light in a specific wavelength range resulting in a specific color of the emitted light depending on the used materials. Examples for such LED dice with a structure of stacked layers are described for example in U.S. Pat. No. 6,650,044 B1 and in U.S. Pat. No. 7,049,159 B2. Since such an LED die does not naturally emit white light, a phosphor material is usually applied to the LED die in order to adjust the color of the emitted light such that the light appears as substantially white light to the human eye.

Further, in order to distribute the light emitted by the LED die in a desired manner, LED devices may be additionally provided with a white reflector layer. A method for manufacturing an LED device with a reflector layer is described in U.S. Pat. No. 8,921,131 B2.

The conventional approaches for forming a phosphor layer and a reflector layer usually use molding techniques, such as injection molding or transfer molding as described in U.S. Pat. No. 8,921,131 B2, or dispensing/spraying techniques, such as using a nozzle to dispense the reflector material or spraying the phosphor material onto the LED die. However, these approaches typically are not sufficiently precise and require post-processing, such as grinding the material layer formed by molding to a desired final thickness. These additional processes make the conventional approaches slow and impose a risk of damaging the LED die during grinding. Further, additional and expensive special-purpose equipment, such as machines for molding, spraying and post-processing, is required and grinding increases the waste of the used materials, thus increasing production costs. In addition, the conventional approaches cannot control the sharpness of printed layer edges to a sufficient degree and suffer from the effect of surface tension due to the liquid nature of the liquid materials used for forming the phosphor layer and the reflector layer prior to their solidification and thus the formation of a meniscus such that the flatness of the surfaces cannot be sufficiently well controlled.

SUMMARY

Accordingly, various aspects of this disclosure provide an LED device, including an LED die. The LED device further includes a phosphor material layer disposed over the LED die. The LED device further includes a reflector material layer at least partially surrounding a side surface of the phosphor material layer such that a rounded interface is formed between the reflector material layer and the phosphor material layer.

Various aspects of this disclosure further provide an LED device, including an LED die and a reflector material layer which at least partially surrounds a side surface of the LED die and which includes a surface with a concave profile. The concave profile is formed such that the concave profile is curved towards an electrode of the LED die.

Various aspects of this disclosure further provide a method of manufacturing an LED device. The method includes positioning a first stencil over a carrier and printing a phosphor material onto the carrier through at least one aperture of the first stencil to form a phosphor material piece on the carrier. The method further includes attaching an LED die onto the printed phosphor material piece.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various aspects of this disclosure provide an LED device that may be manufactured in a faster and more cost-efficient manner with less production defects and higher yield compared with a conventional LED device, and a corresponding method of manufacturing the same. Further, such an LED device may have an improved performance of the reflector layer to enhance light distribution and has improved reliability and durability compared with a conventional LED device.

An exemplary LED device will now be described in detail with reference to FIGS. 1A to 5.

Figure 1A:
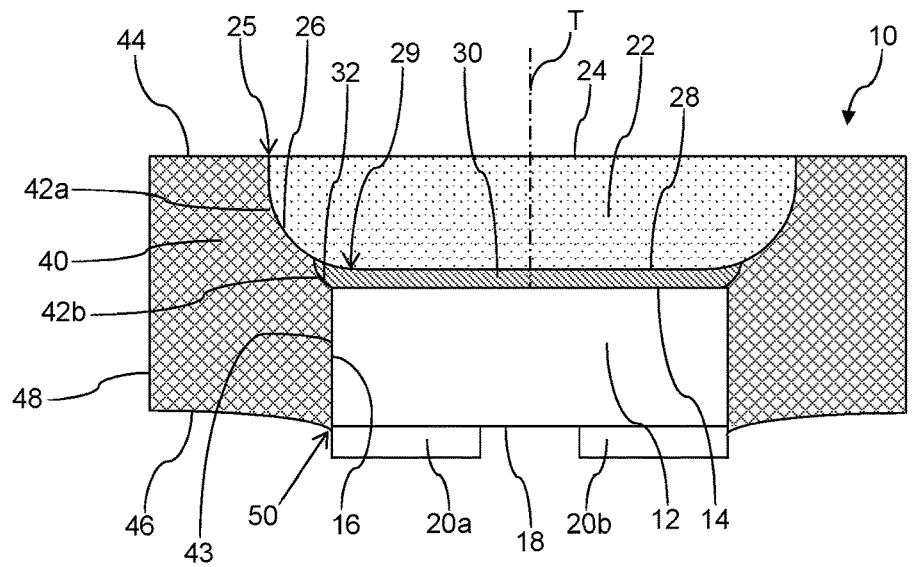
FIG. 1A is a schematic cross-sectional view of an LED device along line A-A of FIG. 3.
Figure 1B:
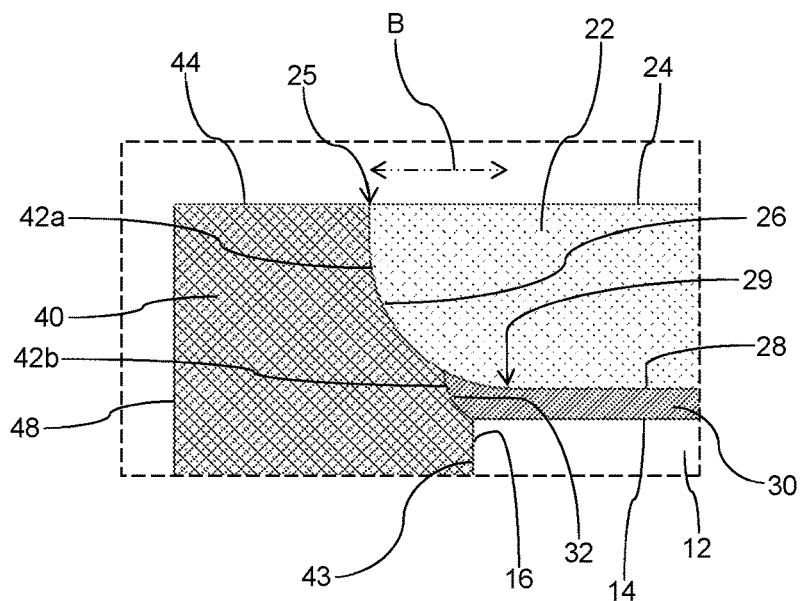
FIGS. 1B and 1C are enlarged cross-sectional views of the LED device 10 shown in FIG. 1A
Figure 1C:
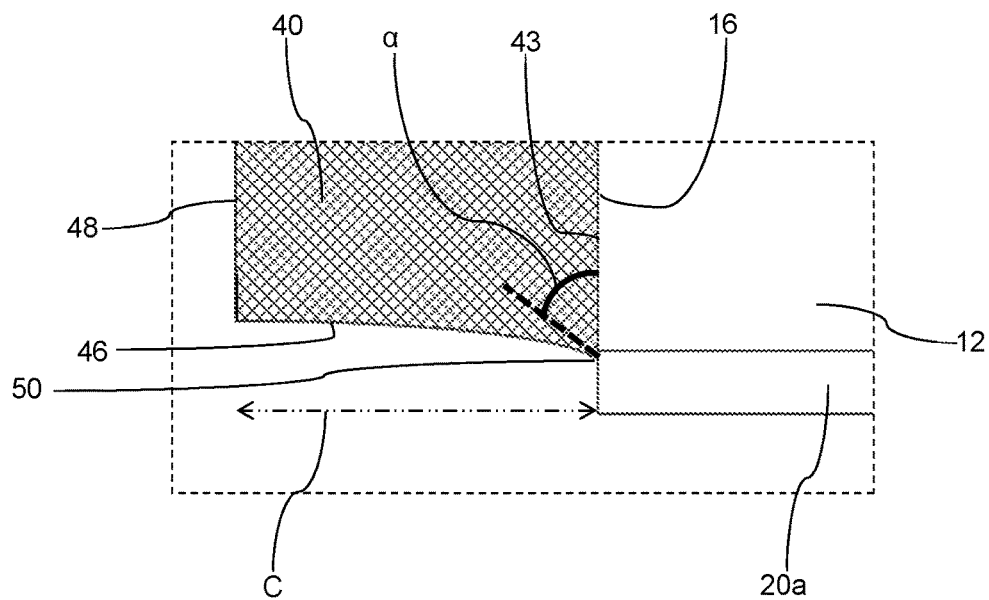
Figure 3:
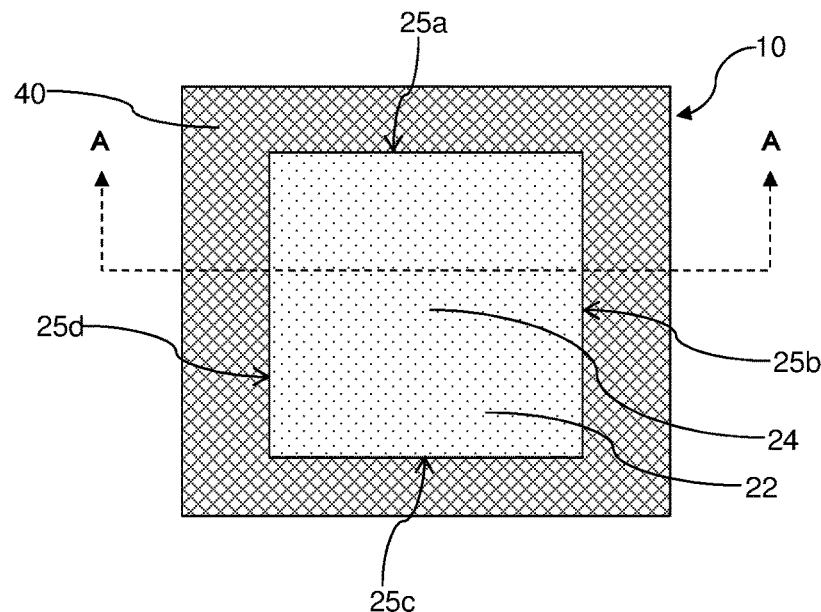
FIG. 3 is a schematic top view of the LED device.

FIG. 1A is a schematic cross-sectional view of an LED device 10 according along line A-A of FIG. 3, and FIGS. 1B and 1C are enlarged cross-sectional views of the LED device 10 shown in FIG. 1A. The LED device 10 may be embodied in the form of a chip-scale package, but is not limited thereto. The LED device 10 includes an LED die 12 which includes a top surface 14, a side surface 16 and a bottom surface 18. The LED die 10 is configured to emit light from its top surface 14. To this end, the LED die 10 may include below the top surface thereof a structure of stacked layers configured to emit light. The structure of stacked layers may include semiconductor layers, such as a p-type Gallium Nitride layer and an n-type Gallium Nitride layer, and may additionally include other active layers depending on the composition of the LED die. Various other structures of stacked layers for LED dice may be realized in the LED die 12. For example the structure of stacked layers for the LED devices described in U.S. Pat. No. 6,650,044 B1 and U.S. Pat. No. 7,049,159 B2 may be used in the LED die 12 and the various examples are not limited to a specific structure of LED die 12. The top surface 14 may be part of a top layer, such as a transparent material layer (e.g. a sapphire substrate), of the structure.

Further, the bottom surface 18 is disposed spaced apart from and opposite the top surface 14. The top surface 14 and the bottom surface 18 may be parallel to each other and may extend substantially horizontally. The bottom surface 14 includes at least one electrode. By way of example, the bottom surface 14 of the LED die 12 shown in FIGS. 1A to 5 includes a first electrode 20a and a second electrode 20b electrically coupled to the structure of stacked layers of the LED die 12 to provide electrical energy for light generation, but is not limited thereto.

Figure 4:
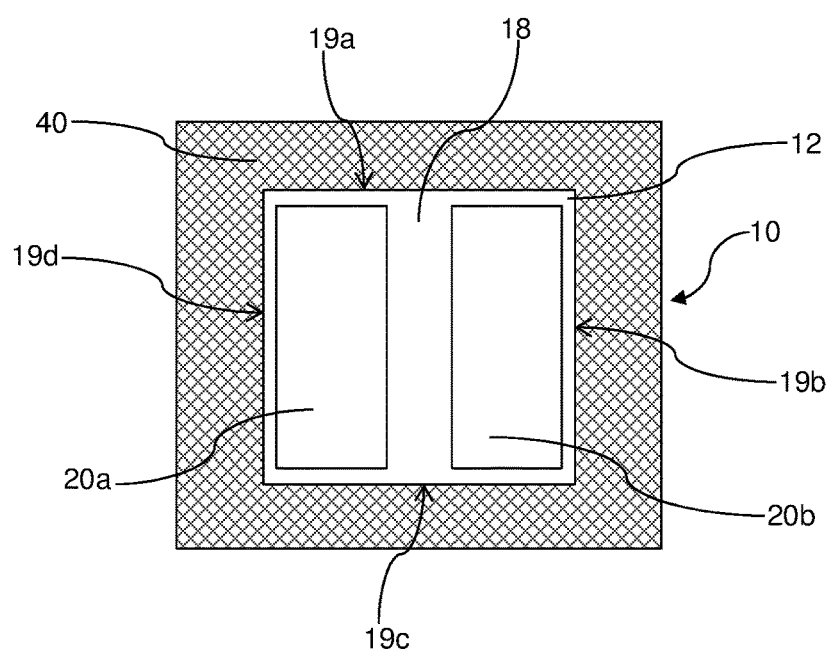
FIG. 4 is a schematic bottom view of the LED device.

The side surface 16 connects the top surface 14 and the bottom surface 18 with each other. The side surface 16 may extend substantially vertically. The side surface 16 surrounds the top surface 14 and the bottom surface 18 while connecting the top surface 14 and the bottom surface 18 with each other. For example, the top surface 14 and the bottom surface 18 may each include four edges which are respectively connected to each other by side surface 16 (exemplarily, the four edges 19a to 19d of the bottom surface 18 are indicated in FIG. 4). Although the top and bottom surfaces of the LED die 12 are shown in the Figures with four edges and with a substantially rectangular shape, it is to be noted that any number of edges and any type of shape can be contemplated for the top and bottom surfaces of the LED die. It is also to be noted that the LED die 12 is shown schematically in the Figures and that the surfaces of the LED die 12 may include various shapes and surface characteristics, such as ridges, depressions, protrusions, etc.

The LED device 10 further includes a phosphor material layer 22 and a reflector material layer 40. A rounded interface is formed between the phosphor material layer 22 and the reflector material layer 40.

The phosphor material layer 22 is disposed over LED die 12, and the phosphor material layer 22 may be attached to the top surface 14 of the LED die 12. The phosphor material layer 22 includes a top surface 24, a side surface 26 and a bottom surface 28. The top surface 24 of the phosphor material layer 22 may be an exposed outer surface of the LED device 10, as shown in the Figures, but is not limited thereto and one or more further layers (e.g. transparent layers) may be disposed over the top surface 24 of the phosphor material layer 22. Further, the top surface 24 and the bottom surface 28 of the phosphor material layer 22 may be substantially flat, but are not limited thereto and may include surface characteristics, such as ridges, depressions, protrusions, etc. An area of the bottom surface 28 of the phosphor material layer 22 may correspond to an area of the top surface 14 of the LED die 12 and an area of the top surface 24 of the phosphor material layer 22 may be larger than an area of the bottom surface 28 of the phosphor material layer 22.

The side surface 26 of the phosphor material layer 22 extends from an edge 25 of the top surface 24 of the phosphor material layer 22 to an edge 29 of the bottom surface 28 of the phosphor material layer 22. The edges 25 and 29 of the top surface 24 and the bottom surface 28 of the LED die 12 are spaced apart from each other by a distance B (illustrated in FIG. 1B) in a lateral direction, and the side surface 26 that connects the top surface 24 and the bottom surface 28 of the phosphor material layer 22 is formed with a curved shape having a convex profile. Accordingly, the side surface 26 extends between the edges 25 and 29 along a trajectory that substantially corresponds to an arc, e.g. a circular arc, as shown in the cross-sectional view of FIG. 1A and FIG. 1B. As further shown in FIG. 1A and FIG. 1B, the phosphor material layer 22 may have a cross-sectional shape of a bisected rectangle with round corners. Further, the edge 25 of the top surface 24 may be disposed in the lateral direction further away from the LED die 12 than the edge 29 of the bottom surface 28 such that the side surface 26 of the phosphor material layer 22 is formed with the convex interface profile.

As shown in the Figures, the bottom surface 28 and the top surface 24 of the phosphor material layer 22 may each have a substantially rectangular shape with a respective perimeter portion including four edges that define the rectangular shape (the four edges 25a, 25b, 25c and 25d of the top surface 24 are exemplarily shown in FIG. 3). The side surface 26 may then accordingly extend from the perimeter portion of the top surface 24 to the perimeter portion of the bottom surface 28 of the phosphor material layer 22. The four edges of the perimeter portion of the top surface 24 of the phosphor material layer 22 may be spaced apart from each other by a distance in a lateral direction and the side surface 26 that connects perimeter portions of top and bottom surfaces 26 and 28 of the phosphor material layer 22 may be formed along the perimeter portions with a curved shape having a convex profile in a similar manner as described above with respect to edges 25 and 29. The four edges may also be disposed in a respective lateral direction further away from the LED die 12 than the four edges of the perimeter portion of the bottom surface 28 of the phosphor material layer 22. Although the top surface 24 and the bottom surface 28 of the phosphor material layer 22 have been described above and are shown in the FIG. 1A to FIG. 5 in connection with a rectangular shape, it is to be understood that the shape of the top surface 24 and the bottom surface 28 of the phosphor material layer 22 is not limited thereto. The top surface 24 and the bottom surface 28 of the phosphor material layer 22 may have other shapes with other numbers of edges (e.g. a circular shape with only one edge defining the circular shape or any kind of polygonal shape with any number of edges) depending on the used LED die and the intended distribution of the light emitted from the LED device.

The phosphor material layer 22 includes a phosphor material that is configured to allow light emitted from the top surface 14 of the LED die 12 to pass therethrough and to simultaneously adjust the color of said light such that the color of the light that is finally emitted from the LED device 10 substantially corresponds to white light. Further information about the phosphor material for the phosphor material layer 22 will also be given below.

Figure 5:
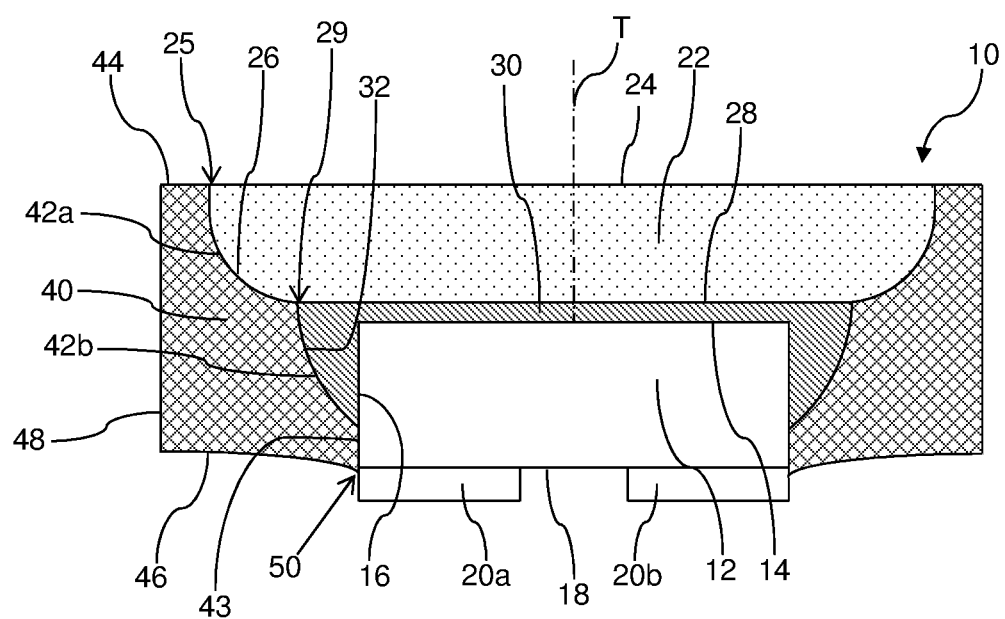
FIG. 5 is a schematic cross-sectional view of an LED device in which an adhesive layer is formed to at least partially surround the side surface of the LED die.

An adhesive material layer 30 attaches the bottom surface 28 of the phosphor material layer 22 and the top surface 16 of the LED die 12 to each other. The adhesive material layer 30 is connected at an upper side thereof to the bottom surface 28 of the phosphor material layer 22 and is connected at a lower side thereof to the top layer 18 of the LED die 12. As shown in FIG. 5, the adhesive material layer 30 may also be formed such that it at least partially surrounds the side surface 16 of the LED die 12, e.g. at least partially surround the side surface 16 between the top surface 14 and the bottom surface 18 of the LED die 12. The adhesive material layer 30 is at least partially made of an adhesive material that is configured to allow light emitted from the top surface 16 of the LED die 12 to pass therethrough, such as a clear glue material. However, any adhesive material that is at least partially permeable to light emitted by the LED die 12 (e.g. any transparent adhesive material) may be used for the adhesive material layer 30.

The reflector material layer 40 is configured to reflect light emitted from the LED die 12. For example, the reflector material layer 40 includes a reflector material (e.g. a white reflector material) that is configured to reflect light emitted from the LED die 12 and passing through phosphor material layer 22. Further information about reflector material for the reflector material layer 40 will also be given further below.

The reflector material layer 40 at least partially surrounds the side surface 26 of the phosphor material layer 22 (e.g. surrounds the side surface 26 of the phosphor material layer 22 along at least a part of the convex interface profile of the side surface 26 between edges 25 and 29) such that the rounded interface is formed between the reflector material layer 40 and the phosphor material layer 22. As shown in FIG. 1A to FIG. 5, the reflector material layer 40 surrounds the side surface 26 of the phosphor material layer 22, e.g., along at least a portion (for example along the entire length) of the convex interface profile of the side surface 26 from edge 25 of the top surface 24 to edge 29 of the bottom surface 28 of the phosphor material layer 22. The reflector material layer 40 includes an interface surface 42a (also called a first interface surface 42a) corresponding to the side surface 26 of the phosphor material layer 22. The interface surface 42a is formed with a concave interface profile. The rounded interface between the reflector material layer 40 and the phosphor material layer 22 may include, for example, a curvature with a curvature radius that is substantially constant. Therefore, the rounded interface between the reflector material layer 40 and the phosphor material layer 22 provides an improved reflection effect for light emitted from the LED die 12. The rounded interface between the reflector material layer 40 and the phosphor material layer 22 may further be configured such that at least a portion of the light emitted from the LED die 12 is reflected by the reflector material layer 40 at the rounded interface such that the rays of the reflected portion of light extend in parallel to an optical axis T that is perpendicular to the top surface of the LED die, thereby further improving the light distribution effect provided by the reflector material layer 40.

As shown in FIG. 1A, FIG. 1B and FIG. 5, the reflector material layer 40 at least partially surrounds a side surface 32 of the adhesive material layer 30 such that a rounded interface is formed between the reflector material layer 40 and the adhesive material layer 30. The side surface 32 of the adhesive material layer 30 is formed with a convex interface profile, and the reflector material layer includes an interface surface 42b (also called a second interface surface 42b) corresponding to the side surface 32 of the adhesive material layer 30. The interface surface 42b is formed with a concave interface profile. As shown in FIG. 1A and FIG. 5, the reflector material layer 40 surrounds the side surface 32 of the adhesive material layer 30, e.g., along at least a portion (e.g. the entire length) of the convex interface profile of the side surface 32 of the adhesive material layer 30. The rounded interface between the reflector material layer 40 and the adhesive material layer 30 includes, for example, a curvature with a curvature radius that is substantially constant. The rounded interface between the reflector material layer 40 and the adhesive material layer 30 may further be configured such that at least a portion of the light emitted from the LED die 12 (e.g. emitted from the side edge portion of the top surface 14 of the LED die 12) is reflected by the reflector material layer 40 at the rounded interface between the reflector material layer 40 and the adhesive material layer 30 such that the rays of the reflected portion of light extend in parallel to an optical axis T that is substantially perpendicular to the top surface 14 of the LED die 12.

The reflector material layer 40 also includes a top surface 44 and a bottom surface 46. As shown in FIG. 1A and FIG. 5, the top surface 44 and the bottom surface 46 of the reflector material layer 40 are connected with each other, on one side, by an outer side surface 48 and, on the opposite side, by the first interface surface 42a, the second interface surface 42b and an inner side surface 43. The bottom surface 46 and the outer side surface 48 may be exposed outer surfaces of the LED device 10, as shown in the Figures, but are not limited thereto and further material layers may cover the bottom surface 46 and the outer side surface 48. As further shown in FIG. 1A and FIG. 5, the inner side surface 43 of the reflector material layer 40 extends at least partially along the side surface 16 (e.g. extends along the entire length of the side surface 16) of the LED die 12 between the second interface surface 42b and the bottom surface 46 of the reflector material layer 40 such that the reflector material layer 40 at least partially surrounds the side surface 16 of the LED die 12. The top surface 44 of the reflector material layer 40 surrounds the top surface 24 of the phosphor material layer 22, and the top surface 24 of the phosphor material layer 22 is substantially flush with the top surface 44 of the reflector material layer 40. Similar to the top surface 24 of the phosphor material layer 22, the top surface 44 of the reflector material layer 40 may be an exposed surface, as shown in the Figures, but is not limited thereto and one or more further layers may be disposed over the top surface 44 of the phosphor material layer 40. The top surface 44 of the reflector material layer 40 may be substantially flat, but is not limited thereto.

The bottom surface 46 is disposed spaced apart from and opposite the top surface 44. The bottom surface 46 has a concave profile which is formed such that the concave profile is curved towards an electrode (e.g. the first electrode 20a and the second electrode 20a, respectively) of the LED die 12. The concave profile is, for example, curved towards the electrode 20a with respect to a lateral distance C from the LED die 12. As shown in FIG. 1A, FIG. 1C and FIG. 5, the concave profile of the bottom surface 46 is curved towards the electrode of the LED die 12 such that the bottom surface 46 of the reflector material layer 40 contacts the side surface 16 of the LED die 12 at a contact portion 50 (e.g. a contact portion between the top surface 14 and the bottom surface 18 of the LED die 12). A contact angle α between the surface of the reflector material layer and the side surface of the LED die may be smaller than 90 degrees. The concave profile of the bottom surface 46 and the resulting contact angle between the bottom surface 46 of the reflector material layer 40 and the side surface 16 of the LED die 12 reduce the occurrence of poor contact (e.g. poor contact between the LED die 12 and the reflector material layer 40) and of void creation and, thus, the reliability and durability of the LED device 10 is increased and less production defects and higher yield are achieved during manufacture of the LED device 10.

The exemplary LED device 10 described above with reference to FIG. 1A to FIG. 5 includes, on the one hand, the rounded interface between the reflector material layer and a phosphor layer and/or between the reflector material layer and the adhesive material layer as well as includes, on the other hand, a surface of the reflector material layer 40 with said surface having a concave profile curved towards an electrode of the LED die 12. However, it is to be understood that the examples also encompass an LED device 10 that includes a rounded interface between the reflector material layer 40 and a phosphor layer 22 and/or between the reflector material layer 40 and the adhesive material layer 30. The bottom surface 46 does not necessarily have a concave profile curved towards an electrode 20a 20b of the LED die 12. It is to be further understood that the examples also encompass an LED device 10 that includes a surface of the reflector material layer 40 with said surface having a concave profile curved towards an electrode 20a, 20b of the LED die 12, but does not necessarily include the aforementioned rounded interface(s).

In the following, a method 200 for manufacturing an LED device, such as the LED device 10 described above and shown in FIG. 1A to FIG. 5, will be described in detail with reference to the FIG. 6 to FIG. 23.

Figure 6:
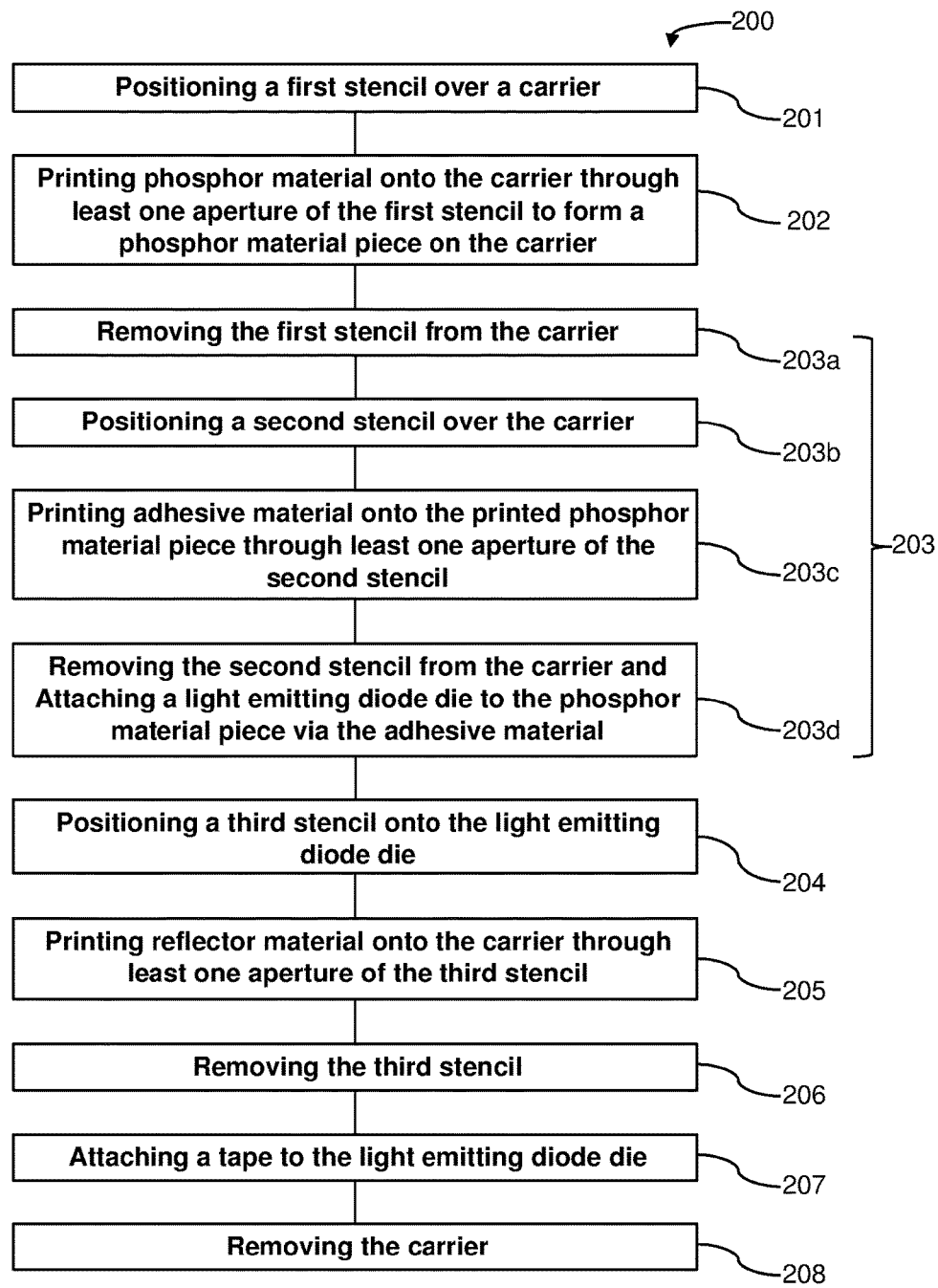
FIG. 6 is a flowchart illustrating a method for manufacturing an LED device.

FIG. 6 illustrates the method 200 for manufacturing an LED device according to the invention and FIG. 7 to FIG. 23 illustrate respective processes of the method 200 of FIG. 6 and elements used in the method 200 of FIG. 6.

Figure 7:
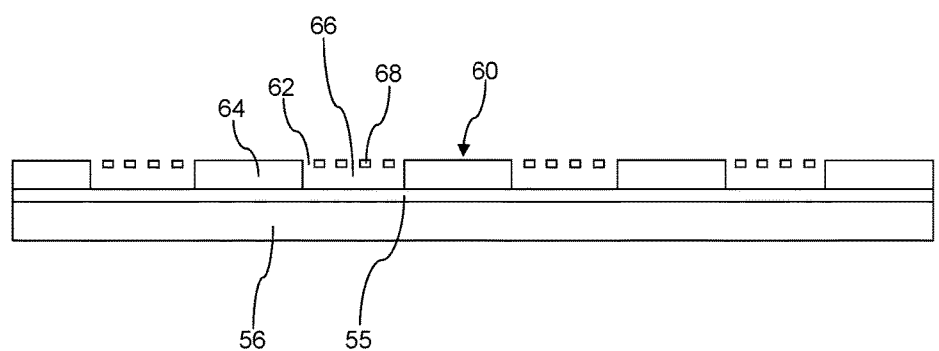
FIG. 7 illustrates a process of positioning a first stencil over a carrier in a manufacturing method.

The method 200 includes, in 201, positioning a first stencil 60 over a carrier 55 as shown in FIG. 7. The method 200 may further include, before positioning the first stencil 60 over the carrier 55, attaching the carrier 55 to a substrate 56, such as a glass plate. The substrate 56 may include at least one marking (not shown) indicating a position at which phosphor material 70 is to be printed onto the carrier 55, and the carrier 55 may be transparent such that the marking on the substrate 56 is visible through the carrier 55. A release film, such as a transparent release film, may be provided as the carrier 55. The release film may include a predefined release mechanism, the release mechanism being configured to release a connection between the release film and a part attached to the release film upon activation.

Figure 8:
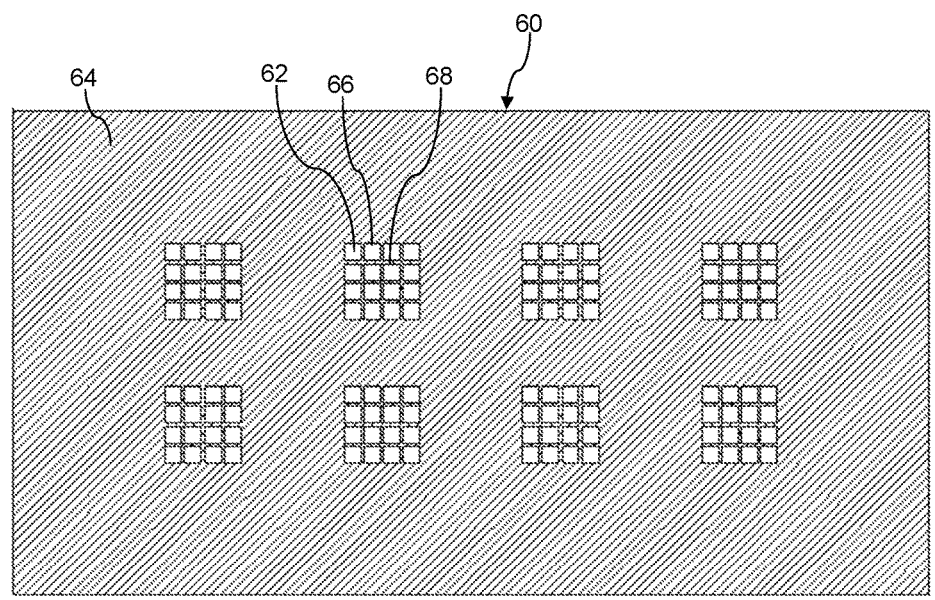
FIG. 8 is a plan view of an exemplary first stencil.

FIG. 8 is a plan view of an exemplary first stencil 60. The exemplary first stencil 60 includes at least one aperture 62. The aperture 62 is formed in a plate body 64. The exemplary first stencil 60 includes an opening 66 and includes a mesh portion 68 disposed within the opening 66 such that the mesh portion 66 partitions the opening into a plurality of apertures 62 in the first stencil, and the phosphor material 70 is printed onto the carrier 55 through the apertures 62. As illustrated in FIG. 8, the exemplary first stencil 60 may include a plurality of openings 66 with corresponding mesh portions 68, each opening including a respective plurality of apertures 62 formed by the corresponding mesh portion 68 (only one of said elements of the first stencil being indicated by reference signs in FIG. 8 for the sake of clarity).

Figure 9:
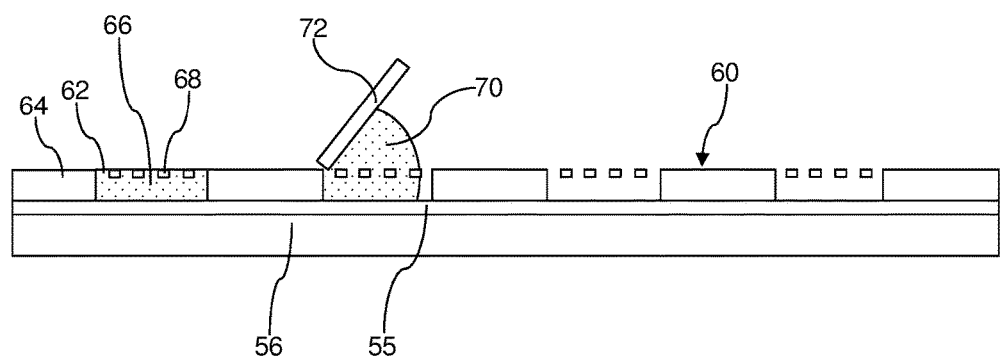
FIG. 9 illustrates a process of printing phosphor material onto the carrier through the first stencil in a manufacturing method.

The method 200 further includes, in 202, printing the phosphor material 70 onto the carrier 55 through the at least one aperture 62 of the first stencil 60 to form a phosphor material piece (which corresponds to the phosphor material layer of the LED device to be manufactured and will therefore be denoted below with the same reference sign 22) on the carrier 55. As illustrated in FIG. 9, the phosphor material 70 is provided on the first stencil 60 and a squeegee device 72 is used to push the phosphor material 70 across the top surface of the first stencil 60 (e.g. by moving the squeegee device 72 from left to right in FIG. 9) and into the at least one aperture 62. As the squeegee device 72 pushes the phosphor material 70 over the at least one aperture 62, the phosphor material 70 flows through the at least one aperture 62, fills the opening 66 of the first stencil 60 and is disposed on the carrier 55.

The phosphor material is, for example, a curable liquid composition including phosphor particles and being configured such that it is able to flow through the aperture(s) 62 in the first stencil 60 and does not collapse or spread after the first stencil 60 is removed from the carrier 55 (e.g. due to viscosity of the printed phosphor material). Examples of phosphor materials as described in U.S. Pat. No. 6,650,044 B1 and U.S. Pat. No. 7,049,159 may be provided in various examples of methods and LED devices according to this disclosure.

Figure 10:
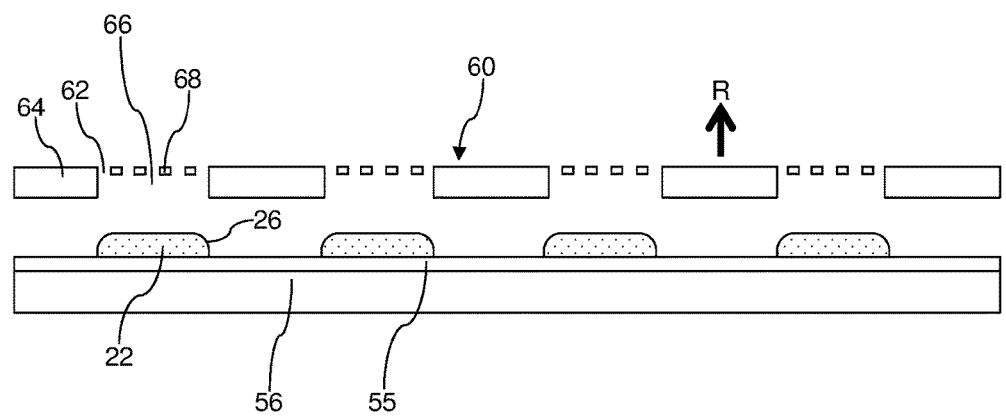
FIG. 10 illustrates a process of removing the first stencil from the carrier in a manufacturing method.

The method 200 further includes, in 203, attaching an LED die 12 onto the printed phosphor material piece 22. Attaching the LED die 12 onto the printed phosphor material piece 22 may include in 203a removing the first stencil 60, e.g. by lifting the stencil 60 from the carrier 55 in the direction of arrow R as illustrated in FIG. 10. Printing the phosphor material piece 22 by the first stencil 60 in 202 and then removing the first stencil 60 in 203a results in the printed phosphor material piece 22 which includes a curved side surface corresponding to the side surface 26 of the phosphor material layer as described with reference to FIG. 1A to FIG. 5.

Figure 11:
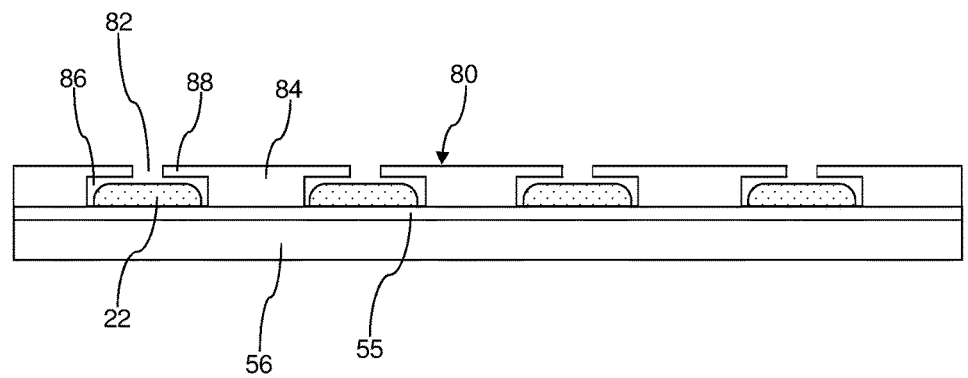
FIG. 11 illustrates a process of positioning a second stencil over a carrier in a manufacturing method.
Figure 12:
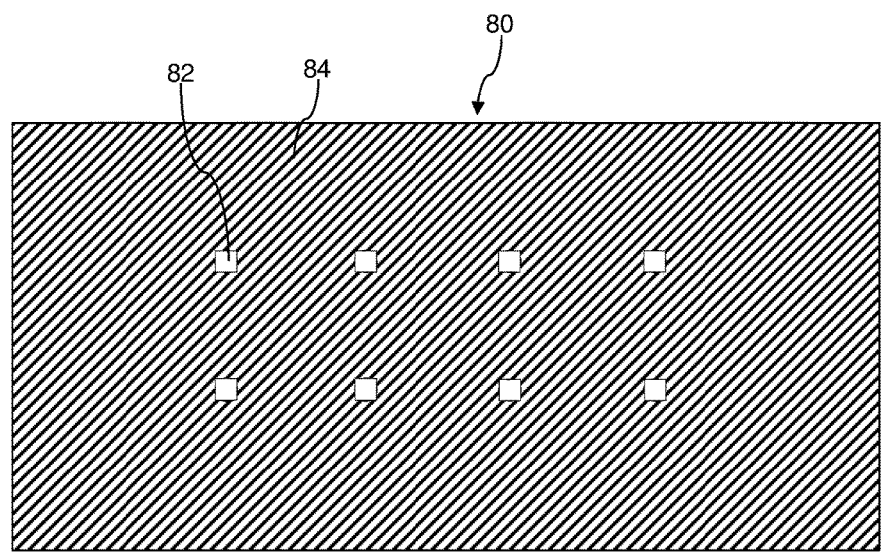
FIG. 12 is a plan view of an exemplary second stencil.

As illustrated in FIG. 11, attaching the LED die 12 onto the printed phosphor material piece 22 may then include in 203b positioning a second stencil 80 over the carrier 55 such that an opening 82 in the second stencil 80 corresponds to a location (e.g. a central location) on top of the printed phosphor material piece 22. FIG. 12 is a plan view of an exemplary second stencil 80. The exemplary second stencil 80 includes a plate body 84 and at least one opening 82 formed within the plate body 84. The exemplary second stencil 80 further includes a recess portion 86 which is formed in the plate body 84 with the recess portion 86 being in fluid-connection with the opening 82 and which is disposed below the opening 82. The exemplary second stencil 80 is positioned over the carrier 55 such that the printed phosphor material piece 22 is at least partially disposed within the recess portion 86 as shown in FIG. 11. The exemplary second stencil 80 further includes a covering portion 88 of the plate body 84. The opening 82 is formed in the covering portion 88 of the second stencil 80. The exemplary second stencil 80 is positioned over the carrier 55 such that a portion of the printed phosphor material piece 22 is covered by the covering portion 88 of the second stencil 80 and such that a portion (e.g. a central portion) of the printed phosphor material piece 22 is exposed through the opening 82 of the second stencil 80. The opening 82 in the second stencil 80 thus allows printing of adhesive material 90 onto the printed material piece 22. As illustrated in FIG. 12, the exemplary second stencil 80 may include a plurality of openings 82 in the plate body 84 of the second stencil 80, the number of openings 82 in the second stencil 80 corresponding to the number of phosphor material pieces 22 printed with the first stencil 60 in step 202.

Figure 13:
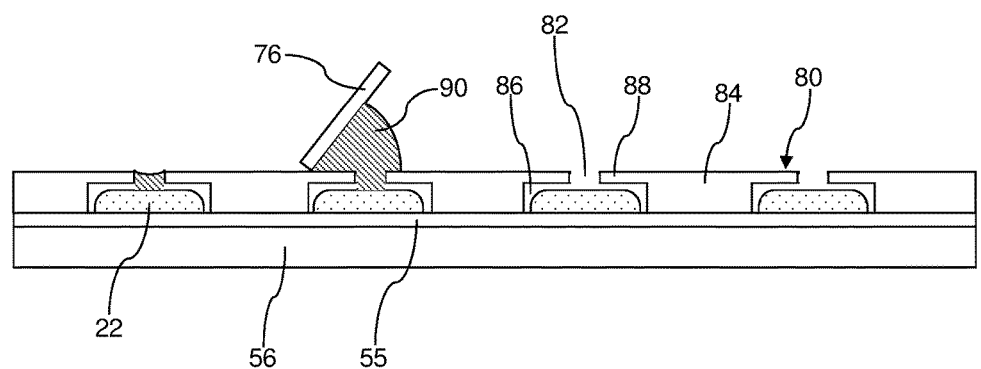
FIG. 13 illustrates a process of printing an adhesive material onto a printed phosphor material piece via the second stencil in a manufacturing method.

Attaching the LED die 12 onto the printed phosphor material piece 22 may then further include, in 203c, printing an adhesive material 90 onto the printed phosphor material piece 22 through the opening 82 of the second stencil 80. As illustrated in FIG. 13, the adhesive material 90 is provided on the second stencil 80 and a squeegee device 76 is used to push the adhesive material 90 across the top surface of the second stencil 80 (e.g. by moving the squeegee device 76 from left to right in FIG. 13) and into the opening 82. As the squeegee device 76 pushes the adhesive material 90 over the opening 82, the adhesive material 90 flows through the opening 82 and is disposed over the printed phosphor material piece 22. As described hereinabove with respect to FIG. 1A to FIG. 5, the adhesive material may be a clear glue material or any suitable adhesive material that is at least partially permeable for light emitted by the used LED die.

Figure 14:
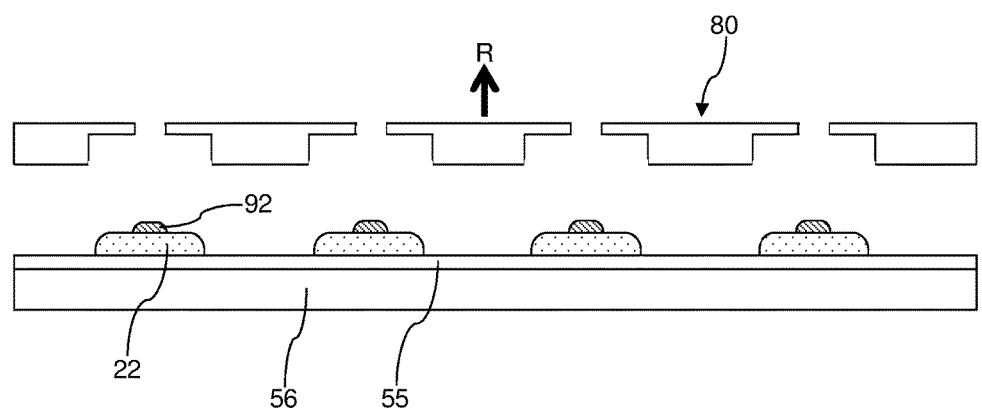
FIG. 14 illustrates a process of removing the second stencil from the carrier in a manufacturing method.
Figure 15:
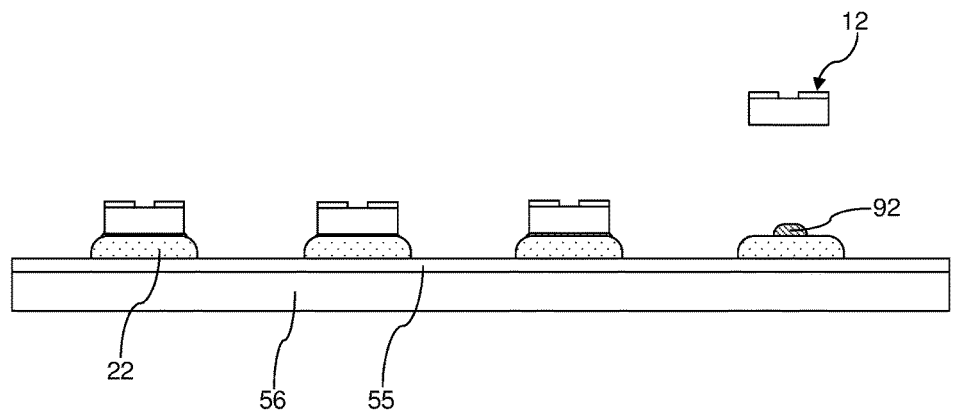
FIG. 15 illustrates a process of attaching an LED die to the printed phosphor material piece in a manufacturing method.
Figure 16A:
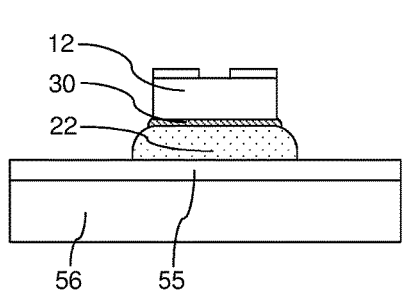
FIGS. 16A and 16B illustrate intermediate LED devices during in a manufacturing method prior to application of reflector material.
Figure 16B:
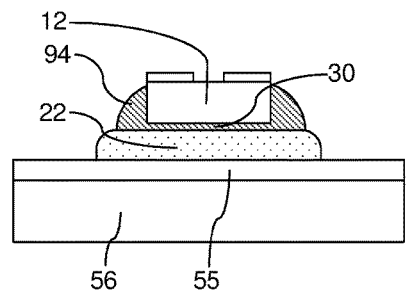

Attaching the LED die 12 onto the printed phosphor material piece 22 in 203 may further include, in 203d, removing the second stencil 80, e.g. by lifting the second stencil 80 from the carrier 55 in the direction of arrow R as illustrated in FIG. 14, and then, as illustrated in FIG. 15, attaching the LED die 12 to the printed phosphor material piece 22 by the printed adhesive material, thereby forming the adhesive material layer 30 between the printed phosphor material piece 22 and the LED die 12. As shown in FIG. 14 and FIG. 15, removing the second stencil 80 may result in an adhesive material drop 92 on the printed phosphor material piece 22. The amount of adhesive material that is printed onto the printed phosphor material piece 22 may be set such that, when the LED die 12 is attached to the printed phosphor material piece 22 by the printed adhesive material, the side surface 16 of the LED die 12 may be substantially free of adhesive material and an adhesive material layer 30 is formed between the printed phosphor material piece 22 and the LED die 12, as illustrated in FIG. 16A. The amount of adhesive material that is printed onto printed phosphor material piece 22 may also be set such that, when the LED die 12 is attached to the printed phosphor material piece 22 by the printed adhesive material, a portion of the adhesive material at least partially surrounds the LED die 12 (e.g. the side surface 16 thereof) to form a convex fillet 94 around the LED die 12, as illustrated in FIG. 16B.

Figure 17:
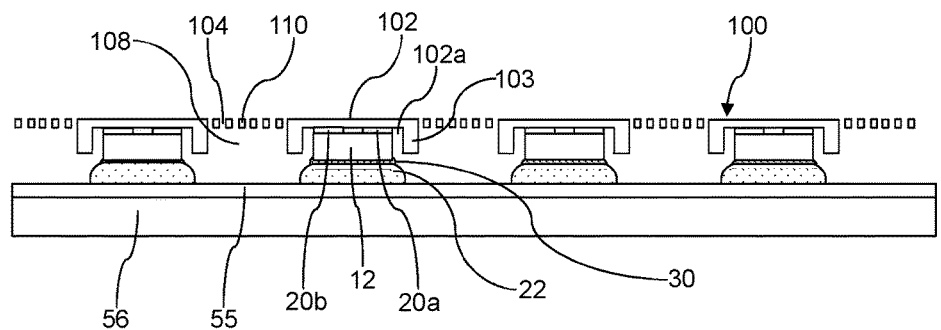
FIG. 17 illustrates a process of positioning a third stencil over a carrier in a manufacturing method.
Figure 18:
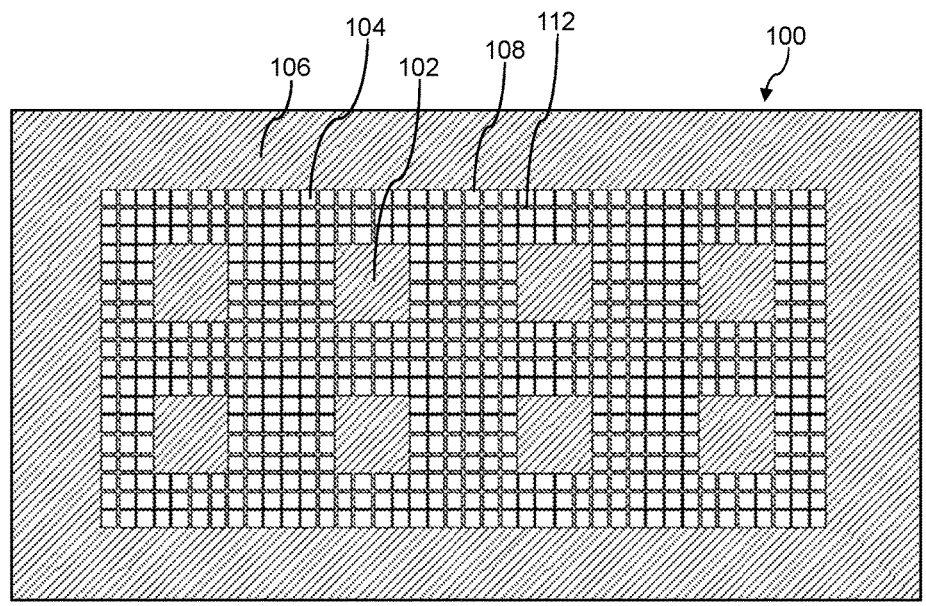
FIG. 18 is a plan view of an exemplary third stencil.

The method 200 may further include, in 204, positioning a third stencil 100 onto the LED die 12 such that a covering portion 102 of the third stencil 100 covers the at least one electrode (e.g. both electrodes 20a and 20b as shown in FIG. 17) of the LED die 12 and such that at least one aperture 104 in the third stencil 100 is positioned over a carrier surface (e.g. a portion of the carrier 55) that at least partially surrounds the printed phosphor material piece 22. FIG. 18 is a plan view of an exemplary third stencil 100. The exemplary third stencil 100 includes a plate body 106 and at least one aperture 104 formed within the plate body 106. The exemplary third stencil 100 further includes a recess portion 102a in the covering portion 102. The exemplary third stencil 100 is positioned onto the LED die 12 such that the LED die 12 is at least partially disposed within the recess portion 102a. The exemplary third stencil 100 further includes a protrusion portion 103 protruding from the covering portion 102 in a direction towards the carrier 55. The protrusion portion 103 may be formed integrally with the covering portion 102 and define the recess portion 102a of the covering portion 102 as shown in FIG. 17. The exemplary third stencil 100 is positioned onto the LED die 12 such that a gap within the recess portion 102a is formed in the lateral direction between the LED die 12 (e.g. the side surface of the LED die 12) and the protrusion portion 103 of the third stencil 100. The exemplary third stencil 100 further includes an opening 108 surrounding the covering portion 102 of the third stencil and further includes a mesh portion 110 disposed in the opening 108 and connected to the covering portion 102 such that the mesh portion 110 partitions the opening 108 into a plurality of apertures 104 through which the reflector material 120 is printed onto the carrier 55. As illustrated in FIG. 18, the exemplary third stencil 100 may include a plurality of openings 108 with corresponding mesh portions 112, each opening including a respective plurality of apertures 104 formed by the corresponding mesh portion 112 (only one of said elements of the third stencil 100 being indicated by reference signs in FIG. 18 for the sake of clarity).

Figure 2:
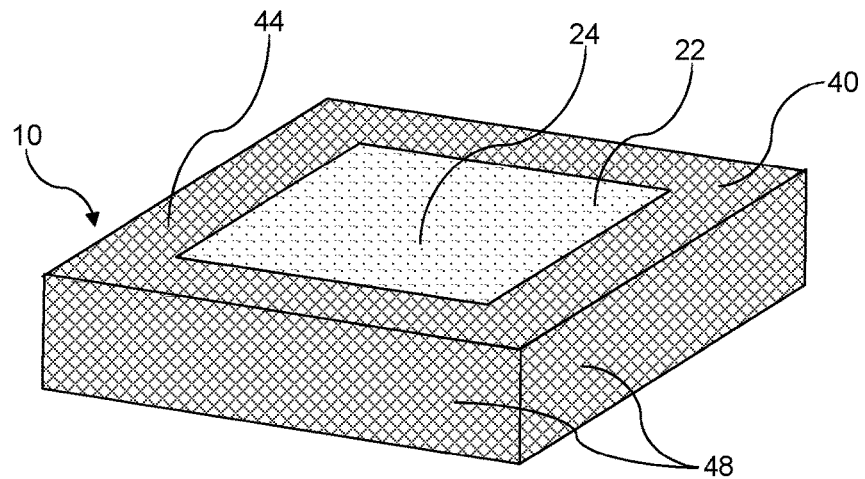
FIG. 2 is a schematic perspective view of the LED device.
Figure 19:
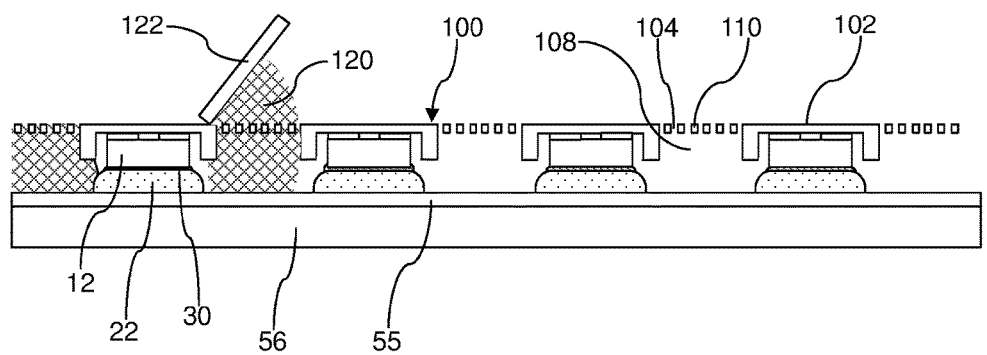
FIG. 19 illustrates a process of printing reflector material onto the carrier via the third stencil in a manufacturing method.
Figure 20:
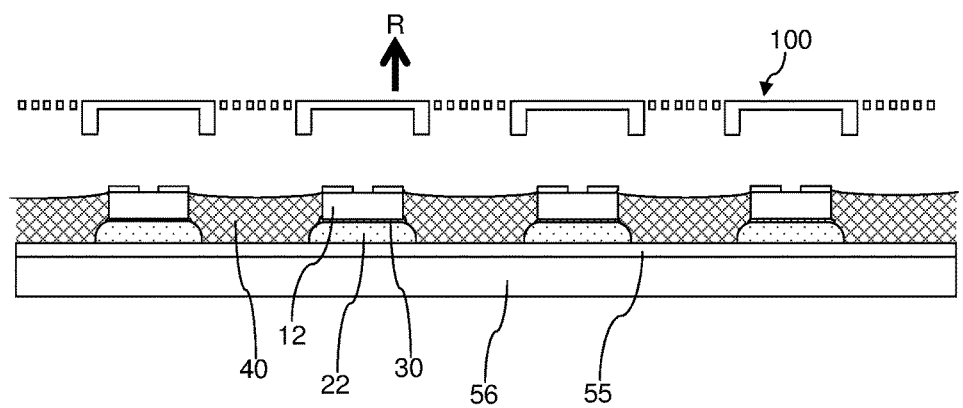
FIG. 20 illustrates a process of removing the third stencil in a manufacturing method.

The method 200 may further include, in 205, printing a reflector material 120 onto the carrier 55 through the at least one aperture 104, as illustrated in FIG. 19. As illustrated in FIG. 19, the reflector material 120 is provided on the third stencil 100 and a squeegee device 122 is used to push the reflector material 120 across the top surface of the third stencil 100 (e.g. by moving the squeegee device 122 from left to right in FIG. 19) and into the at least one aperture 104. As the squeegee device 122 pushes the reflector material 120 over the at least one aperture 104, the reflector material 120 flows through the at least one aperture 104, at least partially fills the opening 108 of the first stencil 100 and is disposed on the carrier 55. The reflector material 120 may be printed onto the carrier 55 in 205 such that the resulting reflector material layer 40 surrounds the side surfaces of both the printed phosphor material piece 22 and the LED die 12 in a closed manner, i.e. that it extends along all four edges of the printed phosphor material piece 22 and the LED die 12, as illustrated in FIG. 2 to FIG. 4. During the printing of the reflector material 120 in 205, the cover portion 102 prevents the electrodes of the LED die 12 from being covered with reflector material 120. By printing the reflector material 120 in 205, the printed reflector material layer 40 that at least partially surrounds the LED die 12, the adhesive material layer 30 and the printed phosphor material piece 22 is formed. As shown in FIG. 19 and FIG. 20, the reflector material 120 may be printed onto the carrier 55 such that a surface of the printed reflector material layer 40 (corresponding to the top surface 44 of the reflector material layer 40 of the LED device 10 after the manufacturing process) and a surface of the printed phosphor material piece 22 (corresponding to the top surface 24 of the phosphor material layer 22 of the LED device 10 after the manufacturing process), said surfaces being in contact with the carrier 55, are substantially flush with each other.

The reflector material 120 is, for example, a curable liquid composition configured such that it is able to flow through the aperture(s) 104 in the third stencil 100 and to spread at least without climbing up to and/or spilling over the top surface of the LED die 12. The reflector material 120 may include a mixture of titanium oxide and other compounds. Suitable reflector materials are known to the skilled person in the art, such as OP957-5W available from Penchem Technologies.

The method 200 may further include, in 206, removing the third stencil 100, e.g. by lifting the stencil 100 from the carrier 55 in the direction of arrow R as illustrated in FIG. 20. As is also shown in FIG. 20, the reflector material can form in its at least partially liquid state (i.e. before it is fully cured) a concave meniscus while adhering to the side surface of the LED die 12 without spilling over the top surface of the LED die 12 and, therefore, printing the reflector material layer 40 using the third stencil 100 and then removing the third stencil 100 can consequently result in the formation of the reflector material layer 40 which includes the surface with the concave profile that is formed such that the concave profile is curved towards the electrode(s) of the LED die 12 (said surface with the concave profile corresponding to the bottom surface 46 of the phosphor material layer 40 as described with reference to FIG. 1A to FIG. 5).

Figure 21:
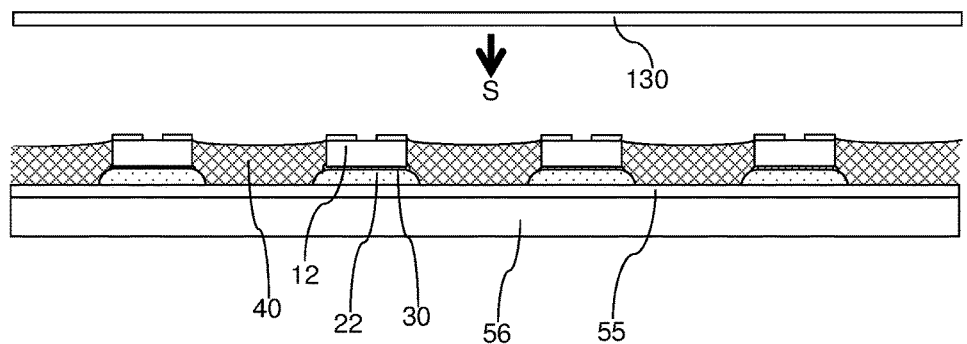
FIG. 21 illustrates a process of attaching a tape to the electrodes of the LED die in a manufacturing method.

The method 200 may further include, in 207, attaching a tape 130 onto the at least one electrode (e.g. to both electrodes 20a and 20b) of the LED die 12, e.g. by placing the tape 130 in the direction of arrow S from above onto the LED die 12 as illustrated in FIG. 21. The tape may be an adhesive tape and may adhere to the electrode(s) of the LED die 12. The tape 130 may be mounted on a stabilizing ring (e.g. a metal ring) and may be provided for holding the manufactured LED device after the manufacturing process is finished.

Figure 22:
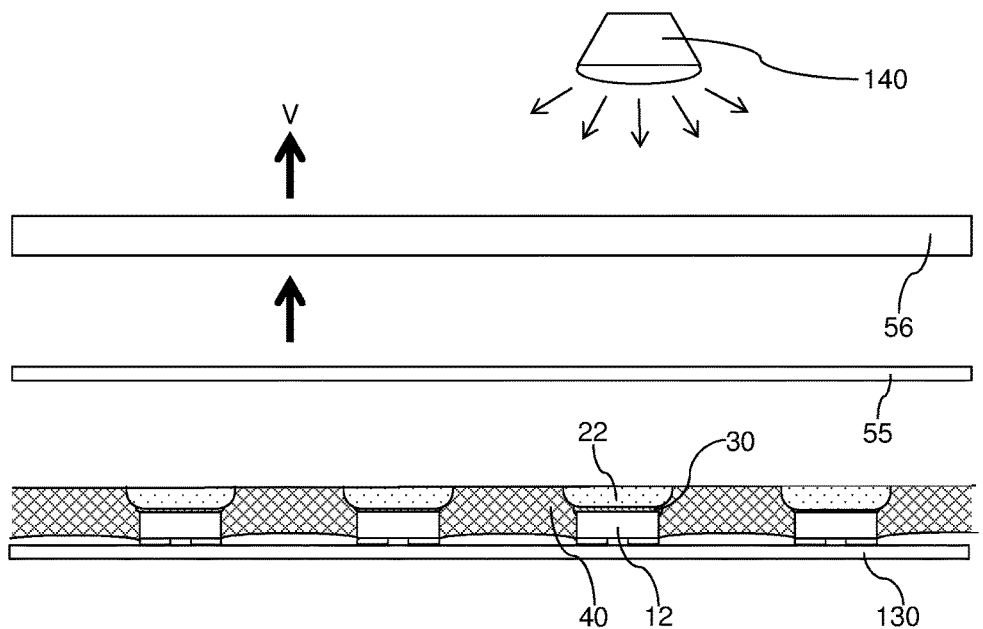
FIG. 22 illustrates a process of removing the carrier and the substrate in a manufacturing method.

The method 200 may further include, in 208, removing the carrier 55 from the printed phosphor material piece 22 and the printed reflector material layer 40. In case a release film is provided as the carrier 55, removing the carrier 55 from the printed phosphor material piece 22 and the printed reflector material layer 40 in 208 may be performed by activating the predefined release mechanism of the release film. FIG. 22 illustrates an example, in which the release film is a UV release film having a predefined release mechanism that is activated upon exposure to ultraviolet (UV) radiation. As is shown in FIG. 22, the release film is exposed through a substrate 56 to UV radiation emitted by a UV radiation source 140 in order to activate the release mechanism. In such a case, the substrate 56 and the UV release film forming the carrier 55 are both at least partially permeable to ultraviolet radiation in order to allow activation of the release mechanism provided on both sides of the UV release film. After activation of the release mechanism, the connection between substrate 56 and the UV release film is released and the connection between the UV release film and the printed phosphor material piece 22 and reflector material layer 40 is released. Therefore, substrate 56 can be detached from the UV release film in the direction of arrow V in FIG. 22 and then the UV release film can be detached from the printed phosphor material piece 22 and the printed reflector material layer 40 in the same direction. It is to be noted that the whole structure in FIG. 22 of the LED device to be manufactured has been flipped by 180 degrees for the process of removing the carrier 55, but the examples are not limited thereto. In another example, the release film is a thermal release film having a predefined release mechanism that is activated upon application of heat, and removing the carrier from the printed phosphor material piece 22 and the printed reflector material layer 40 can be performed by applying heat to the carrier 55, the printed phosphor material piece 22 and the printed reflector material layer 40 by a heat source such that the release mechanism of the thermal release film is activated. The carrier 55 and the substrate 56 may be removed subsequently (as illustrated in FIG. 22) or removed as one unit (e.g. in case that substrate 56 and the release film are fixedly connected to each other).

The method 200 may also include a process of curing the printed phosphor material piece after printing the phosphor material and/or after removing the first stencil, and a process of curing the adhesive layer between the printed phosphor material piece and the LED die after attaching the LED die to the printed phosphor material piece by the printed adhesive material, and a process of curing the printed reflector material layer after printing the reflector material and/or after removing the third stencil. For example, the phosphor material and/or the reflector material may be at least partially cured after printing and before removing the respectively used stencil and may then be fully cured after the correspondingly used stencil is subsequently removed.

Figure 23:
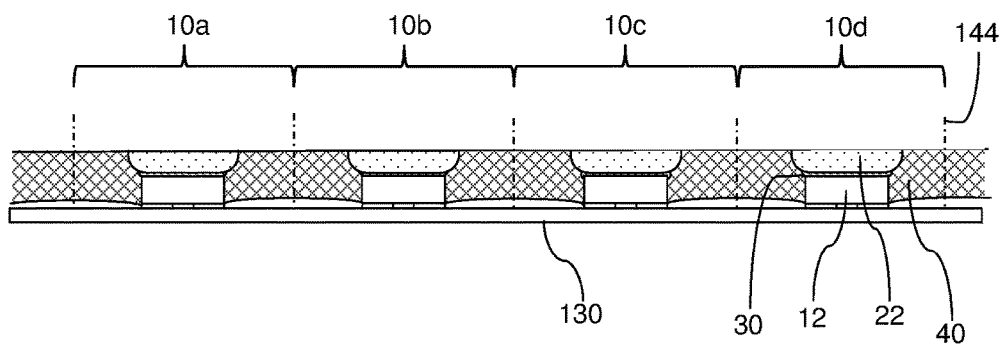
FIG. 23 illustrates a process of singulating a plurality of LED dice to form separate LED devices in a manufacturing method.

Although the method 200 illustrated in FIG. 6 has been described with reference to the manufacturing of one LED device, it is apparent to the skilled person that the method 200 may also be implemented to produce simultaneously a plurality of LED devices. The method 200 may therefore also include printing a plurality of phosphor material pieces onto the carrier, attaching a plurality of LED dice onto the plurality of phosphor material pieces, and singulating the LED dice from one another to form separate LED devices. FIG. 23 illustrates an example, in which separate LED dice are singulated after the various material layers 22, 30 and 40 have been formed around the LED dice and the tape 130 has been attached as well as the carrier 55 has been removed. The process of singulating the LED dice from one another may be performed by a sawing process along saw lines 144, as shown in FIG. 23, in order to form separate LED devices 10a, 10b, 10c, 10d, each corresponding to the LED device 10 as described hereinbefore. When simultaneously producing a plurality of LED devices, the aforementioned processes of the method 200 illustrated in FIG. 6 may optionally also be performed correspondingly, for example, to form a plurality of adhesive material layers for attaching the LED dice to the phosphor material pieces, respectively, to print the reflector material layer 40 such that it surrounds the plurality of LED dice, adhesive layers and phosphor material pieces, and so on by use of the above described stencils.

The method may be performed under normal room temperatures and normal pressure, thus reducing the stress that builds up in the material layers. Further, there is substantially no need for planarizing processes and/or processes for removing excess material, which are usually performed by grinding. Further, due to the use of the above described stencils, material leakage during manufacturing can be reduced.

The invention claimed is:

1. A method for manufacturing a light emitting diode device, the method comprising:
    positioning a first stencil over a carrier;
    printing a phosphor material onto the carrier through at least one aperture of the first stencil to form a phosphor material piece on the carrier; and
    attaching a light emitting diode die onto the printed phosphor material piece,
    wherein attaching the light emitting diode die onto the printed phosphor material piece comprises:
    removing the first stencil and positioning a second stencil over the carrier such that an opening in the second stencil corresponds to a location on top of the printed phosphor material piece;
    printing an adhesive material onto the printed phosphor material piece through the opening of the second stencil; and
    removing the second stencil and attaching the light emitting diode die to the printed phosphor material piece by the printed adhesive material thereby forming an adhesive material layer between the printed phosphor material piece and the light emitting diode die.

2. The method according to claim 1, wherein the second stencil further includes a recess portion disposed below the opening in the second stencil and in connection with the opening in the second stencil, wherein the second stencil is positioned over the carrier such that the printed phosphor material piece is at least partially disposed within the recess portion.

3. The method according to claim 1, the method further comprising:
    positioning a third stencil onto the light emitting diode die such that a covering portion of the third stencil covers an electrode of the light emitting diode die and such that at least one aperture in the third stencil is positioned over a carrier surface that at least partially surrounds the printed phosphor material piece;
    printing a reflector material onto the carrier through the at least one aperture of the third stencil to form a printed reflector material layer that at least partially surrounds the light emitting diode die, the adhesive material layer and the printed phosphor material piece.

4. The method according to claim 3, wherein the third stencil further includes a recess portion in the covering portion and wherein the third stencil is positioned onto the light emitting diode die such that the light emitting diode die is at least partially disposed within the recess portion.

5. The method according to claim 3, the method further comprising:
    removing the third stencil and attaching a tape onto the electrode of the light emitting diode die; and
    removing the carrier from the printed phosphor material piece and the printed reflector material layer.

6. The method according to claim 5, the method further comprising:
    providing a release film as the carrier, wherein the release film comprises a predefined release mechanism, the release mechanism being configured to release a connection between the release film and a part attached to the release film upon activation,
    wherein removing the carrier from the printed phosphor material piece and the printed reflector material layer comprises removing the release film from the printed phosphor material and the printed reflector material by activating the predefined release mechanism.

7. The method according to claim 1, the method further comprising:
    printing a plurality of phosphor material pieces onto the carrier;
    attaching a plurality of light emitting diode dice onto the plurality of phosphor material pieces; and
    singulating the light emitting diode dice from one another to form separate light emitting diode devices.

* * * * *